(12) United States Patent
Duan et al.

(10) Patent No.: US 11,704,271 B2
(45) Date of Patent: Jul. 18, 2023

(54) SCALABLE SYSTEM-IN-PACKAGE ARCHITECTURES

(71) Applicant: Alibaba Group Holding Limited, Grand Cayman (KY)

(72) Inventors: Lide Duan, Sunnyvale, CA (US); Wei Han, Cupertino, CA (US); Yuhao Wang, Sunnyvale, CA (US); Fei Xue, Sunnyvale, CA (US); Yuanwei Fang, Sunnyvale, CA (US); Hongzhong Zheng, Los Gatos, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 27 days.

(21) Appl. No.: 16/998,960

(22) Filed: Aug. 20, 2020

(65) Prior Publication Data

US 2022/0058150 A1    Feb. 24, 2022

(51) Int. Cl.
*G06F 15/16* (2006.01)
*G06F 13/40* (2006.01)
*G06N 20/00* (2019.01)
*H01L 25/18* (2023.01)
*H01L 25/065* (2023.01)
*G06F 13/16* (2006.01)

(52) U.S. Cl.
CPC ...... *G06F 13/4027* (2013.01); *G06F 13/1668* (2013.01); *G06N 20/00* (2019.01); *H01L 25/0657* (2013.01); *H01L 25/18* (2013.01)

(58) Field of Classification Search
CPC . G06F 13/4027; G06F 13/1668; G06N 20/00; H01L 25/0657; H01L 25/18
See application file for complete search history.

(56) References Cited

U.S. PATENT DOCUMENTS

| | | | | |
|---|---|---|---|---|
| 8,407,660 | B2* | 3/2013 | Solomon | G06F 15/803 716/138 |
| 8,653,638 | B2* | 2/2014 | Jones | G06F 13/385 257/686 |
| 8,719,753 | B1* | 5/2014 | Chow | H01L 25/0657 716/116 |
| 9,367,517 | B2* | 6/2016 | Jones | H04L 49/109 |
| 9,479,456 | B2* | 10/2016 | Hutton | G06F 15/7825 |
| 10,496,561 | B2* | 12/2019 | Roberts | G06F 13/161 |
| 10,505,548 | B1* | 12/2019 | Swarbrick | H03K 19/17768 |
| 10,554,496 | B2* | 2/2020 | Norige | H04L 41/147 |
| 10,742,217 | B2* | 8/2020 | Dabral | H01L 25/0655 |

(Continued)

FOREIGN PATENT DOCUMENTS

| | | | | |
|---|---|---|---|---|
| CN | 109952643 A | * | 6/2019 | G11C 5/025 |
| CN | 113924559 A | * | 1/2022 | G06F 15/7825 |
| TW | 202115883 A | * | 4/2021 | H01L 21/78 |

*Primary Examiner* — Cheng Yuan Tseng

(57) ABSTRACT

A system-in-package architecture in accordance with aspects includes a logic die and one or more memory dice coupled together in a three-dimensional slack. The logic die can include one or more global building blocks and a plurality of local building blocks. The number of local building blocks can be scalable. The local building blocks can include a plurality of engines and memory controllers. The memory controllers can be configured to directly couple one or more of the engines to the one or more memory dice. The number and type of local building blocks, and the number and types of engines and memory controllers can be scalable.

18 Claims, 4 Drawing Sheets

(56) References Cited

U.S. PATENT DOCUMENTS

| | | | |
|---|---|---|---|
| 10,754,666 B1* | 8/2020 | Sorani | G06F 15/7825 |
| 10,866,753 B2* | 12/2020 | Noguera Serra | G06F 15/7807 |
| 11,043,472 B1* | 6/2021 | Dokania | H01L 25/0657 |
| 11,081,474 B1* | 8/2021 | Hoang | G11C 16/10 |
| 11,093,673 B2* | 8/2021 | Eghbal | G06F 30/33 |
| 11,152,343 B1* | 10/2021 | Dokania | H01L 23/3672 |
| 11,153,289 B2* | 10/2021 | Jiang | G06F 13/128 |
| 11,164,848 B2* | 11/2021 | Chen | H01L 23/3135 |
| 11,189,338 B1* | 11/2021 | Camarota | H01L 25/18 |
| 11,323,391 B1* | 5/2022 | McColgan | H04L 49/30 |
| 11,386,020 B1* | 7/2022 | Klein | G06F 15/17331 |
| 2008/0126569 A1* | 5/2008 | Rhim | G06F 15/7825 |
| | | | 709/250 |
| 2009/0070721 A1* | 3/2009 | Solomon | H01L 27/11807 |
| | | | 716/118 |
| 2009/0070727 A1* | 3/2009 | Solomon | H01L 21/8221 |
| | | | 716/128 |
| 2019/0266088 A1* | 8/2019 | Kumar | H04L 45/60 |
| 2019/0370269 A1* | 12/2019 | Bogdan | G06F 15/7821 |
| 2020/0365593 A1* | 11/2020 | Chen | H01L 24/17 |
| 2021/0097013 A1 | 4/2021 | Saleh et al. | |
| 2021/0097015 A1 | 4/2021 | Das Sharma et al. | |
| 2021/0117360 A1* | 4/2021 | Kutch | G06F 3/0604 |
| 2021/0124711 A1* | 4/2021 | Ansari | G06F 11/0736 |
| 2021/0245047 A1* | 8/2021 | Dharmapurikar | A63F 13/77 |
| 2021/0303481 A1* | 9/2021 | Ray | G06T 1/20 |
| 2021/0318955 A1* | 10/2021 | Li | G06F 12/0646 |
| 2021/0320080 A1* | 10/2021 | Li | H01L 23/48 |
| 2021/0375681 A1* | 12/2021 | Han | H01L 21/8232 |

\* cited by examiner

SCALABLE SYSTEM-IN-PACKAGE ARCHITECTURES

BACKGROUND OF THE INVENTION

Computing systems have made significant contributions toward the advancement of modern society and are utilized in a number of applications to achieve advantageous results. Devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. A number of technologies need a scalable systems-on-chip (SOCs), application specific integrated circuits (ASICs) or the like coupled to high density memory that provide a high memory bandwidth. However, it is becoming increasingly more difficult to continue to scale conventional SOCs, ASICs and the like and also continue to provide increasingly higher memory densities and higher memory bandwidths.

SUMMARY OF THE INVENTION

The present technology may best be understood by referring to the following description and accompanying drawings that are used to illustrate embodiments of the present technology directed toward a scalable system-in-package (SiP) architecture.

In one embodiment, a SiP can include one or more memory dice and a logic die coupled together in a three-dimensional stack. The logic die can include a plurality of building blocks and one or more net works-on-chip (NOCs) communicatively coupling the plurality of building blocks together. The plurality of building blocks can include one or more global building blocks and a plurality of local building blocks. A local building block can include one or more memory controllers communicatively coupled to the one or more memory dice and a plurality of engines, wherein one or more engines are communicatively coupled to the one or more memory controllers.

In another embodiment, a SiP can include a logic die and one or more memory dice. The logic die can include a plurality of building blocks and one or more global NOCs communicatively coupling the plurality of building blocks together. The plurality of building blocks can include one or more global building blocks and a plurality of local building blocks. Each local building block can include one or more memory controllers, one or more engines, and one or more local NOCs. The one or more memory controllers can communicatively couple at least one engine to the one or more memory dice. The one or more local NOCs can communicatively couple the one or more memory controllers and one or more engines together. The plurality of memory dice and the logic die can be coupled together in a three-dimensional stack.

In yet another embodiment, an edge computing device can include a three-dimensional package stack including one or more memory dice and a logic die. The logic die can include a plurality of building blocks and one or more global NOCs communicatively coupling the plurality of building blocks together. The plurality of building blocks can include one or more global building blocks and a plurality of local building blocks. Each local building block can include one or more memory controllers, one or more engines, and one or more local NOCs. The one or more memory controllers can communicatively couple at least one engine to the one or more memory dice. The one or more local NOCs can communicatively couple the one or more memory controllers and one or more engines together.

In yet another embodiment, as system can include a host and an accelerator communicatively coupled to the host. The accelerator can include logic die and one or more memory dice coupled together in a three-dimensional stack. The logic die can include a plurality of building blocks and one or more global NOCs communicatively coupling the plurality of building blocks together. The plurality of building blocks can include one or more global building blocks and a plurality of local building blocks. Each local building block can include one or more memory controllers, one or more engines, and one or more local NOCs. The one or more memory controllers can communicatively couple at least one engine to the one or more memory dice. The one or more local NOCs can communicatively couple the one or more memory controllers and one or more engines together.

This Summary is provided to introduce a selection of concepts in a simplified form that are further described below in the Detailed Description. This Summary is not intended to identity key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
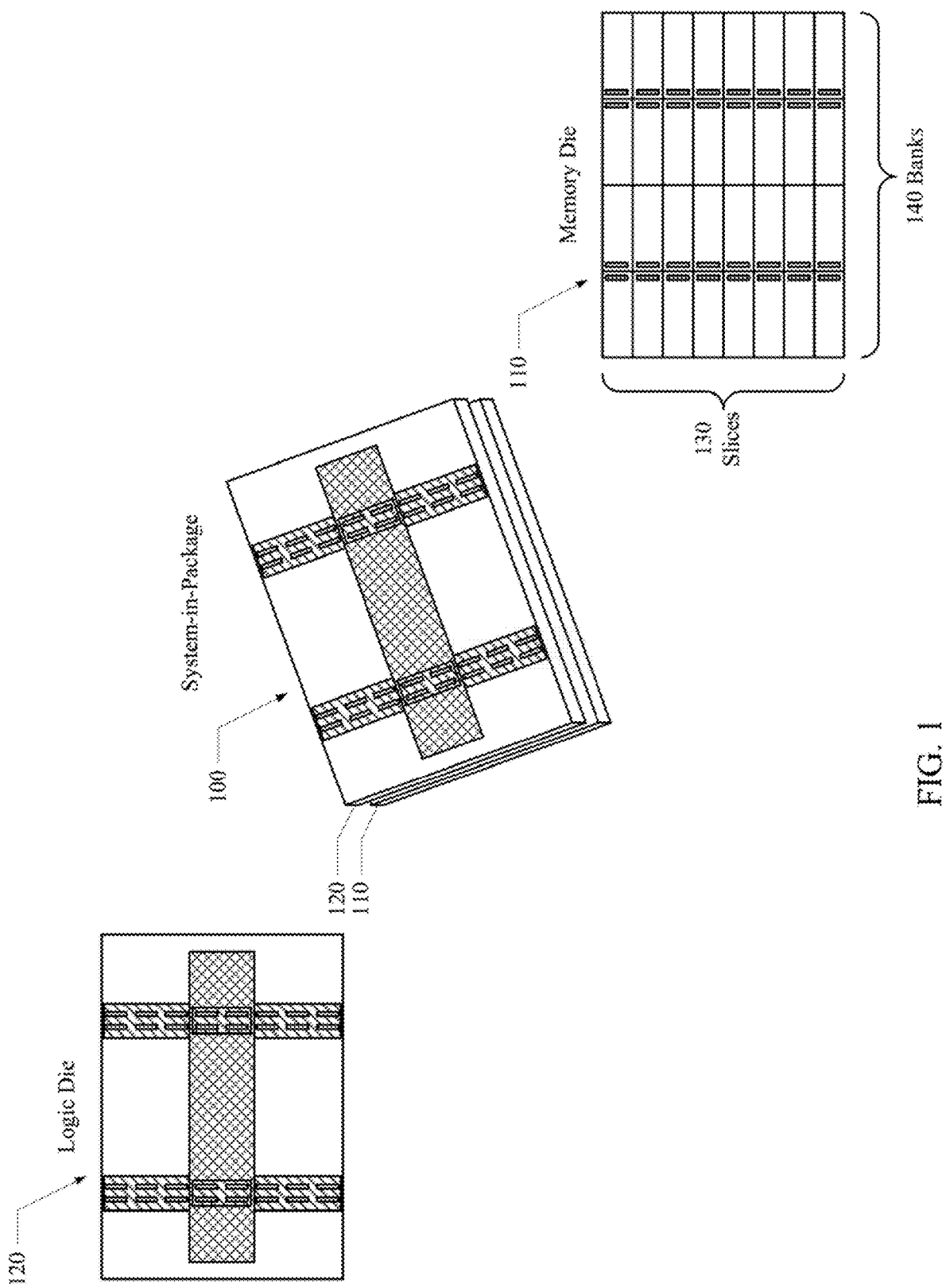
FIG. 1 shows a system-in-package, in accordance with aspects of the present technology.

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the term "and or" includes any and all combinations of one or more of the associated elements. It is also to be understood that the phraseology and terminology used herein is for the purpose of description and should not be regarded as limiting.

Referring to FIG. 1, a system-in-package (SiP), in accordance with aspects of the present technology, is shown. The SiP 100 can include one or more memory dice 110 and a logic die 120 communicatively coupled together in a three-dimensional (3D) stack. In one implementation, the one or more memory dice 110 and the logic die 120 can have the same die size. In addition, independent fabrication processes can be utilized to fabricate the memory die 110 and logic die 120, and therefore neither is constrained by the other. In one implementation, a memory die 110 is hybrid wafer bonded (HWB) to the logic die 120. In hybrid wafer bonding, clean flat and smooth metal and dielectric materials at the surface of the memory die and logic die 120 are respectively bonded together when brought in contact. An annealing process at an elevated temperature may also be utilized to improve the bonds between the memory die 110 and the logic die 120. In another implementation, a plurality of memory dice 110 are coupled to the logic die 120 by a plurality of through-silicon-vias (TSV) or a combination of through-silicon-vias (TSV) and respective microbump array (uBUMP) elements.

In one implementation, the one or more memory dice 110 can be random access memory (RAM) dice, such as but not limited to DDR3, DDR4, GDDR5, or the like. In one implementation, the HWB, TSV or similar means of coupling the one or more memory dice 110 and the logic die 120 can provide one or more wide memory channels. For example, the HWB, TSV or similar coupling means can provide a 1024 bit wide memory channel between the one or more memory dice 110 and the logic die 120. In another example, the HWB, TSV or similar coupling means can provide 16 memory channels, wherein each memory channel is 64 bits wide. In one implementation, the HWB, TSV or similar means of coupling the one or more memory dice 110 and the logic die 120 can provide a high bandwidth communication channel between the tightly coupled one or more memory dice 110 and logic die 120. For example, the HWB, TSV or similar means of coupling can achieve 1 to 2 giga bytes per second (GBps) per pin, with a bandwidth of 128 to 256 GBps. In one implementation, the HWB, TSV or similar means of coupling the one or more memory dice 110 and the logic die 120 can also provide for low power consumption between the lightly coupled one or more memory dice 110 and logic die 120. In one implementation, each memory die 120 can be organized in a plurality of slices 130, banks 140, sub-banks, pages, bytes and or the like. By way of a non-limiting example, a memory die 110 can be organized in eight slices, and each slice can include four banks.

Aspects of the SiP 100 will be further explained with reference to FIG. 2, which shows the logic die 120 in more detail. The logic die 120 can include a plurality of building blocks 205-235 and one or more networks-on-chip (NOCs) 240-245. The building blocks 205-235 can include a plurality of local building blocks 205-215 and one or more global building blocks 220-235. The building blocks can be coupled together by the one or more NOCs 240-245. The one or mow NOCs 240 can be mesh, star, ring, bus, daisy chain or other similar topologies or combinations thereof.

The global building blocks 220-235 can include, but are not limited to, one or more global processors and or controllers 220, one or more peripheral subsystems 225, one or more system management units 230, one or more connectivity systems 230 and or the like communicatively coupled by the one or more NOCs 240-245. The one or more peripheral subsystems 225 can be configured to provide one or more communication interfaces for coupling the logic die 120 to one or more peripheral devices. The communication interfaces can include, but are not limited to, i-square-c ($I^2C$), i-squared-s ($I^2S$), serial peripheral interface (SPI), quad-SPI (QSPI), universal asynchronous receiver/transmitter (UART) interface, general purpose input output (GPIO) interface and or the like. The one or more peripheral subsystems 225 can also provide timers, watch dog timers, real time clocks (RTC) and other similar functions. The system management unit 230 can be configured to manage the configuration initialization and operation of the plurality of building blocks 205-235 and the one or more NOCs 240-245, and manage the workload of the plurality of building blocks 205-235. The system management unit 230 can also be configured to generate clocks, provide for power management and the like. The connectivity subsystem 235 can be configured to provide one or more communication interfaces such as, but not limited to, universal serial bus (USB), peripheral component interface express (PCIe) and or the like. The SiP 100 can optionally include global on-chip memory, such as but not limited to, static random-access memory (SRAM) communicatively coupled to the one or more NOCs 240-245 and or one or more building blocks 205-235.

The local building blocks 205-215 can each include, but are not limited to, one or more memory controllers 250-260, one or more engines 265-290 and one or more NOCs 245. The one or more memory controllers 250-260 can be configured to provide direct access to the one or more memory dice 110 of the SiP 100. The one or more memory controllers 250-260 can also be communicatively coupled to one or more NOCs 245 and one or more engines 265-290 of the respective local building block 205. The one or more engines 265-290 can include, but are not limited to, one or more artificial intelligence (AI) engines 265-275, one or more decoder engines 280, one or more encoder engines 285, one or more local processors and or controllers 290, one or more digital signal processors one or more graphics processing unit, and or combinations thereof. One or more local building blocks 205-215 can also optionally include on-chip memory, such as but not limited to, static random-access memory (SRAM) communicatively coupled to the one or more NOCs 240 and or one or more engines 265-290.

The one or more local processors and or controllers 290 can be configured to manage workloads within the respective local building blocks 205-215. The one or more local processors and or controllers 290 can also be configured to execute certain computing operations. The one or more artificial intelligence engines 265-275 can be configured to offload artificial intelligence (AI) operations from the one or more local processors and or controllers 290. The one or more decoder engines 280 can be configured to offload audio, picture, video and or the like decoding operations from the one or more local processors and or controllers 290. The one or more encoder engines 285 can be configured to offload audio, picture, video and or the like encoding operations from the one or more local processors and or controllers 290.

In one implementation, the communication links from the memory controllers 250-260 to the one or more memory dice 110 and between the memory controllers 250-260 and the one or more engines 265-285 directly connected to respective memory controllers 250-260 can provide a relatively high bandwidth connection. The communication links to and from the local NOCs 245 can provide a relatively moderate bandwidth connection. The communication links to and from the global NOC 240 can provide a relatively low bandwidth connection.

Figure 2:
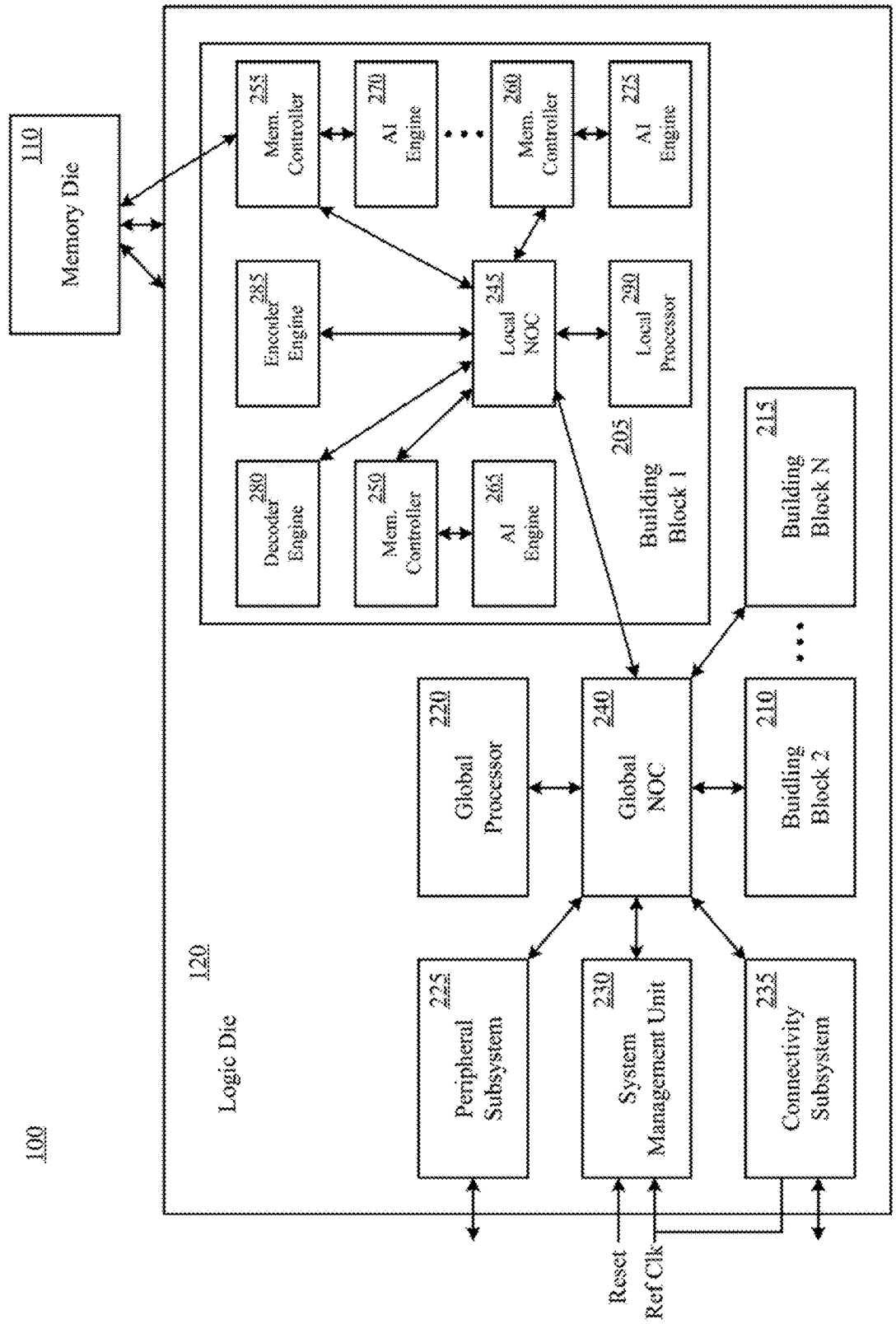
FIG. 2 shows a system-in-package, in accordance with aspects of the present technology.

Aspects of the present technology are not limited to the building blocks 205-235 and one or more networks-on-chip (NOCs) 240-245 as illustrated in FIG. 2. Likewise, aspects of the present technology are not limited to the one or more memory controllers 250-260, one or more engines 265-290 and one or more local NOCs 245 of the respective local building blocks 205-215 as illustrated in FIG. 2. Instead, the architecture of the building blocks 205-235 and one or more networks-on-chip (NOCs) 240-245 of the logic die 120 is scalable, customizable, and configurable. Likewise, the architecture of the local building blocks 205-215 are scalable, customizable, and configurable. In one example, the number of building blocks 210-215 can be changed. For instance, a logic die 120 can be fabricated with 4, 16 or more local building blocks 205-215. The number or type of local building blocks 205-215 can be selected based upon a given application. In another instance, a logic die 120 can be fabricated with a predetermined number of local building blocks 205-215 of one or more types, and then a given set can be enabled based the given application. In addition, a family of SiP products can be manufactures, with each product in the family including a different number or type of local building blocks 205-215. For instance, a product family can offer a first SiP product with 4 local building blocks, a second SiP product with 16 local building blocks, and a third SiP product with 64 local building blocks. In another example, the number of artificial intelligence engines 265-275 can be changed, and or the types of artificial intelligence engines, such as convolution engines, general matrix-matrix multiplication engines and the like, can be changed for a given design. In another example, the types, such as video, picture or audio, the number of encoder and or decoder engines can be changed, and or combined. In another example, the local network on chips (NOCs) and the global network on chips (NOCs) can be merged.

Figure 3:
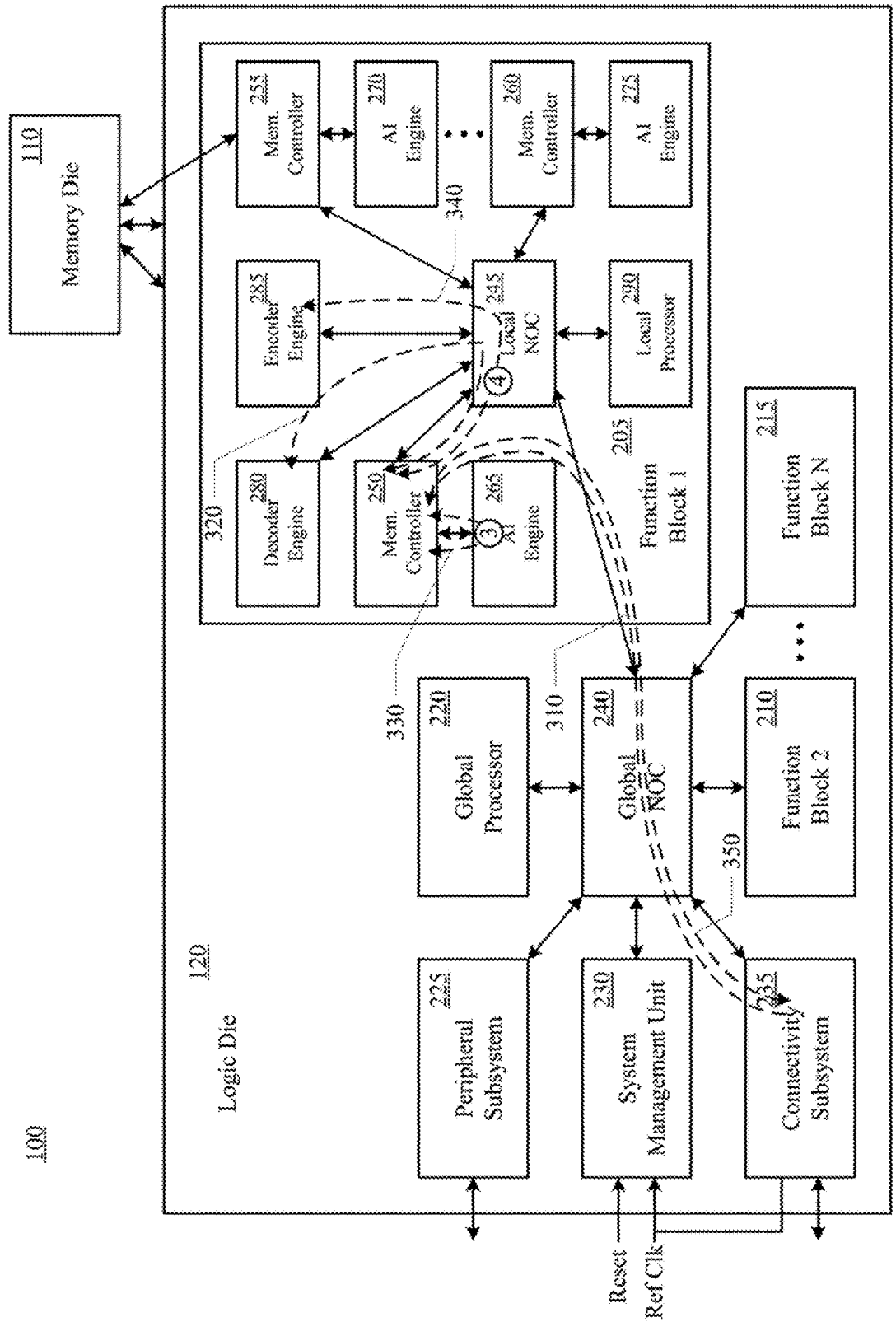
FIG. 3 shows a system-in-package, in accordance with aspects of the present technology.

Referring now to FIG. 3, an exemplary operation of the SiP 100, in accordance with aspects of the present technology, is illustrated. The exemplary operation can be an artificial intelligence (AI) assisted video transcoding. The exemplary video transcoding can begin with loading compressed video frames from an external source, through the connectivity subsystem 235, the global NOC 240, the local NOC 245 and memory controller 250 of a first local building block 205, and into the memory die 110, at 310. At 320, the decoder engine 280 can retrieve the video frames from the memory die 110, through the local NOC 245 and the memory controller 250, decompress the video frames, and store the decompressed frames back to the memory die 110 through the local NOC 245 and the memory controller 250. At 330, the local processor 290 can offload object detection to the artificial intelligence engine 265, which retrieves the decompressed frames from the memory die 110 through the memory controller 250, performs general matrix-matrix multiplication operations as part of the object detection process, and then stores the object detection information back to the memory die 110 through the memory controller 250. At 340, the encoder engine 285 can retrieve the decoded frames and objection detection information from the memory die 110 through the local NOC 245 and memory controller 250, encode the frames utilizing the object detection information, and store the encoded frames back in the memory die 110 through the local NOC 245 and memory controller 250. At 350, the encoded video frames can be output from the memory die 110 through the memory controller 250, the local NOC 245, the global NOC 240 and the connectivity subsystem 235. The exemplary operation described herein is merely for illustrative purposes and is a non-limiting operating example of the SiP 100.

Figure 4:
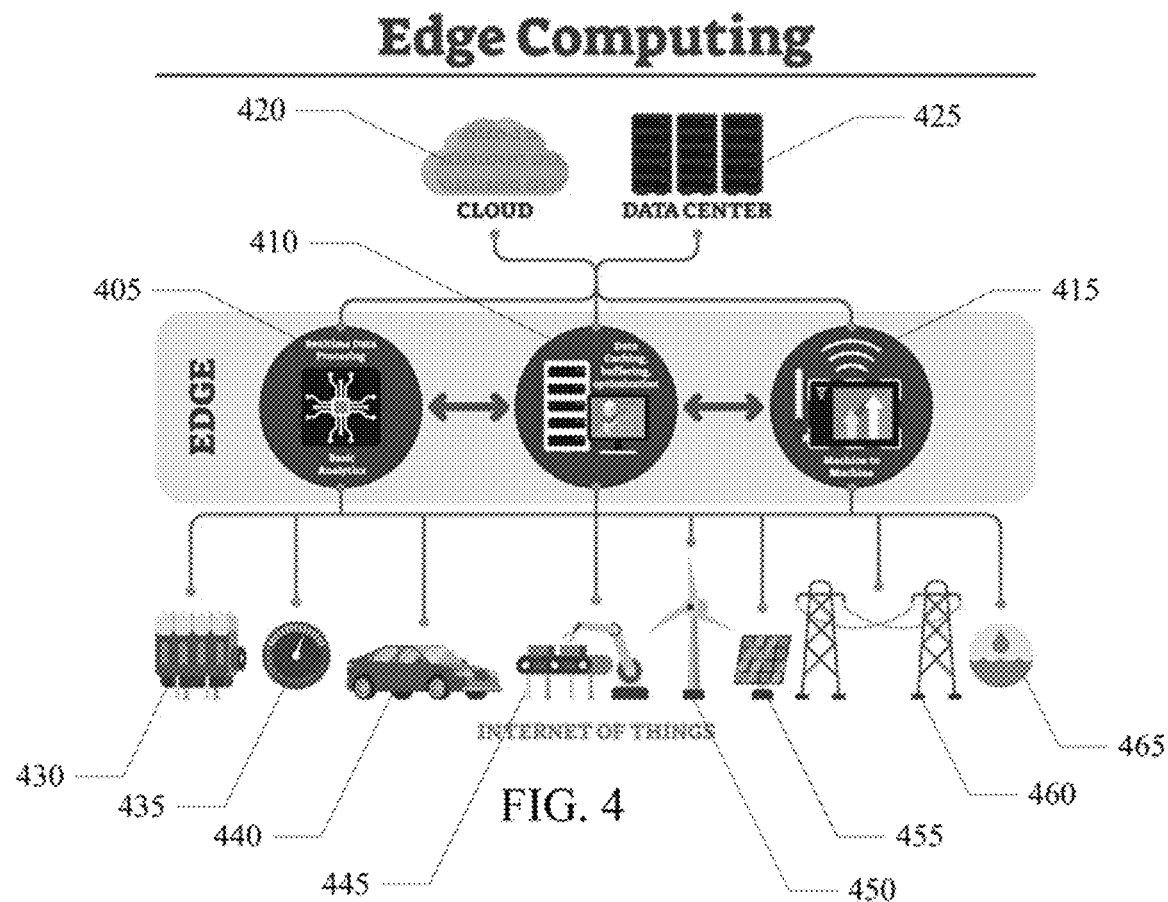
FIG. 4 illustrates exemplary edge computing implementations utilizing the SiP in accordance with aspects of the present technology.

Referring now to FIG. 4, exemplary edge computing implementations utilizing the SiP in accordance with aspects of the present technology are illustrated. An edge computing system can include one or more edge computing devices 405-415 deployed between a cloud computing system 420, data center 425 or the like, and various internet-of-things (IoT) devices 430-460. The internet-of-things devices 430-460 can include but are not limited to, motors 430, gauges 435, vehicles 440, robots 445, wind turbine devices 450, solar panel devices 455, electric transmission devices 460, water meters 465, and or the like. The SiP 100 can be deployed to implement various edge devices 405-410, including but not limited to, realtime data processing basic analytic edge devices 405, data caching, buffering and optimization edge devices 410, machine-to-machine devices 415, and or the like. In the edge device mode, the SiP 100 can be used as a standalone device. The SiP 100 can run a real time operating system (RTOS), and load external programs, data and the like can be loaded via the peripheral subsystem 225 and or connectivity subsystem 235.

Figure 5:
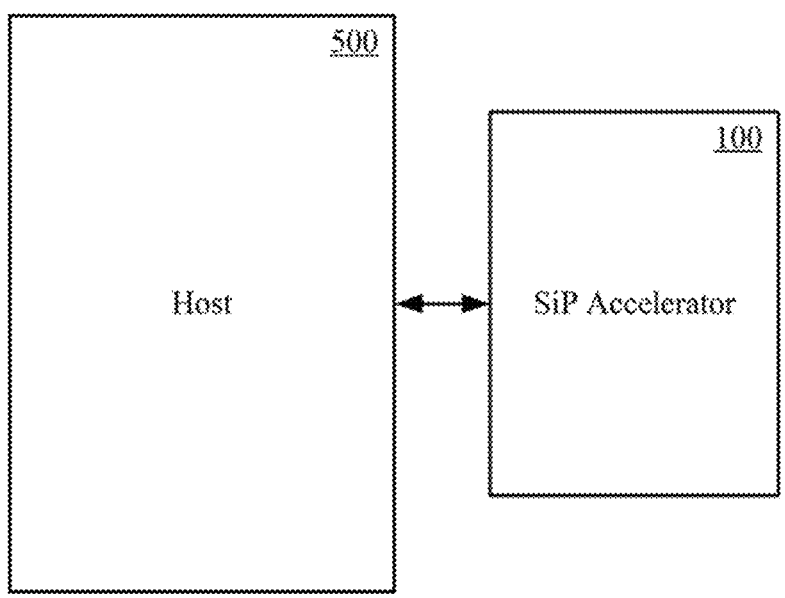
FIG. 5 shows an exemplary accelerator implementation utilizing the SiP in accordance with aspects of the present technology.

Referring now to FIG. 5, an exemplary accelerator implementation utilizing the SiP in accordance with aspects of the present technology is illustrated. A host/accelerator system can include a host device 510 and one or more accelerators. The SiP 100 can be deployed to implement the one or more accelerators. The SiP accelerator 100 can be communicatively coupled to the host 510 via the peripheral subsystem 225 and or connectivity subsystem 235. User programs, data and the like can be loaded by the host 510 to the SiP accelerator 100 via the peripheral subsystem 225 and or connectivity subsystem 235.

Aspects of the present technology advantageously provide a scalable architecture. The number and types of building blocks, the number and types of networks-on-chip, the number and types of memory controllers, the number and types of engines, and the like can be designed, fabricated, configured, initialized and or the like in the scalable architecture. Aspects of the present technology can advantageously be configured as a standalone device, an accelerator or the like. Aspects of the present technology can advantageously be configured for a wide variety of applications, such as but not limited to artificial intelligence, natural language processing, video processing or the like. Aspects of the present technology advantageously provide a large memory capacity and or large memory bandwidth. Aspects of the present technology can also advantageously provide relatively high, moderate and low communication channel bandwidths. Aspects of the present technology can advantageously reduce power consumption, die and package area, and or cost.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A system-in-package (SiP) comprising:
   one or more memory dice;
   a logic die including:
      a plurality of building blocks including one or more global building blocks and a plurality of local building blocks, wherein each of the local building blocks includes one or more memory controllers that directly couple engines of the respective local building block to the one or more memory dice;
      a plurality of networks-on-chip (NOCs) including
         a global NOC communicatively coupling the plurality of building blocks together; and
         one or more local NOCs disposed in respective ones of the one or more local building blocks, wherein the respective local NOC in a respective local building block communicatively couples the one or more memory controllers and the plurality of engines within the respective local building block together; and
   wherein the one or more memory dice and the logic die are directly coupled together using hybrid wafer bonding in a three-dimensional stack.

2. The SiP of claim 1, wherein the logic die further comprises one or more global processors or controllers communicatively coupled to the global NOC.

3. The SiP of claim 1, wherein the logic die further comprises one or more peripheral subsystems communicatively coupled to the global NOC.

4. The SiP of claim 1, wherein the logic die further comprises one or more system management units communicatively coupled to the global NOC.

5. The SiP of claim 1, wherein the logic die further comprises one or more connectivity subsystems communicatively coupled to the global NOC.

6. The SiP of claim 1, wherein one or more of the plurality of local building blocks further comprises one or more decoder engines communicatively coupled to the local NOC.

7. The SiP of claim 1, wherein one or more of the plurality of local building blocks further comprises one or more encoder engines communicatively coupled to the local NOC.

8. The SiP of claim 1, wherein one or more of the plurality of local building blocks further comprises one or more local processors communicatively coupled to the local NOC and configured to manage workloads within the respective local building block.

9. The SiP of claim 1, wherein one or more of the plurality of building blocks further comprises one or more artificial intelligence (AI) engines communicatively coupled to the local NOC and configured to offload AI operations from the one or more local processors.

10. The SiP of claim 1, wherein one or more of the plurality of local building blocks further comprises one or more local controllers communicatively coupled to the local NOC and configured to manage workloads within the respective local building block.

11. The SiP of claim 1, wherein the logic die is configured as a standalone edge device.

12. The SiP of claim 1, wherein the logic die is configured as an accelerator.

13. The SiP of claim 1, wherein the plurality of local building blocks and the one or more networks-on-chip (NOCs) are configurable to provide a scalable SiP architecture.

14. A system-in-package (SiP) comprising:
   one or more memory dice;
   a logic die directly coupled to the one or more memory dice by hybrid wafer bonding in a three-dimensional stack, wherein the logic die includes:
      a plurality of building blocks including one or more global building blocks and a plurality of local building blocks, wherein each local building block includes one or more memory controllers, one or more engines, and one or more local networks-on-chip (NOCs), wherein the one or more memory controllers communicatively couple at least one engine of the logic die directly to the one or more memory dice, and the one or more local NOCs communicatively couple the one or more memory controllers and one or more engines within the respective local building block together; and
one or more global networks-on-chip (NOCs) communicatively coupling the plurality of building blocks together.

15. An edge computing device including a three-dimensional package stack comprising:
one or more memory dice;
a logic die directly coupled to the one or more memory dice by hybrid wafer bonding in a three-dimensional stack, wherein the logic die includes:
a plurality of building blocks including one or more global building blocks and a plurality of local building blocks, wherein each local building block includes one or more memory controllers, one or more engines, and one or more local networks-on-chip (NOCs), wherein the one or more memory controllers communicatively couple at least one engine directly to the one or more memory dice, and the one or more local NOCs communicatively couple the one or more memory controllers and one or more engines within the respective local building block together; and
one or more global networks-on-chip (NOCs) communicatively coupling the plurality of building blocks together.

16. The edge computing device of claim 15, wherein the one or more global building blocks include:
one or more global processors communicatively coupled to the one or more global NOCs;
one or more peripheral subsystems communicatively coupled to the one or more global NOCs;
one or more system management units communicatively coupled to the one or more global NOCs; and
one or more connectivity subsystems communicatively coupled to the one or more global NOCs.

17. A system comprising:
a host;
an accelerator communicatively coupled to the host, wherein the accelerator includes;
one or more memory dice;
a logic die including:
a plurality of building blocks including one or more global building blocks and a plurality of local building blocks, wherein each local building block includes one or more memory controllers, one or more engines, and one or more local networks-on-chip (NOCs), wherein the one or more memory controllers communicatively couple at least one engine of the logic die directly to the one or more memory dice, and the one or more local NOCs communicatively couple the one or more memory controllers and one or more engines within the respective local building block together;
one or more global networks-on-chip (NOCs) communicatively coupling the plurality of building blocks together; and
wherein the one or more memory dice and the logic die are directly coupled together using hybrid wafer bonding in a three-dimensional stack.

18. The system of claim 17, wherein the one or more global building blocks include:
one or more global processors communicatively coupled to the one or more global NOCs;
one or more peripheral subsystems communicatively coupled to the one or more global NOCs and the host:
one or more system management units communicatively coupled to the one or more global NOCs and the host; and
one or more connectivity subsystems communicatively coupled to the one or more global NOCs and the host.

* * * * *